United States Patent [19]

Magill et al.

[11] Patent Number: 5,056,101
[45] Date of Patent: Oct. 8, 1991

[54] MODE PARTITION SCREENING APPARATUS

[75] Inventors: Peter D. Magill, Lakewood; Kenneth C. Reichmann, Hamilton Square, both of N.J.

[73] Assignee: AT&T Bell Laboratories, Murray Hill, N.J.

[21] Appl. No.: 585,763

[22] Filed: Sep. 19, 1990

[51] Int. Cl.$^5$ .............................................. H01S 3/13
[52] U.S. Cl. ......................................... 372/32; 372/9; 372/19; 372/99
[58] Field of Search ................. 372/29, 31, 32, 18, 372/19, 38, 98, 99

[56] References Cited

U.S. PATENT DOCUMENTS

| | | | |
|---|---|---|---|
| 4,450,565 | 5/1984 | Copeland | 372/32 |
| 4,675,873 | 6/1987 | Miller | 372/19 |
| 4,912,716 | 3/1990 | Mead | 372/32 |
| 4,947,398 | 8/1990 | Yasuda et al. | 372/29 |
| 4,975,919 | 12/1990 | Amada et al. | 372/33 |
| 4,982,406 | 1/1991 | Facklam | 372/18 |

OTHER PUBLICATIONS

O. Yuifusa et al., IEEE Trans. on Comm., vol. CO-M-28, No. 2, Feb. 1980, "Laser Mode Partition Noise Evaluation . . . ", pp. 238–243.
P. Liu et al., J. Lightwave Tech., vol. LT-2, No. 1, Feb. 1984, "Statistical Measurements as a Way to Study Mode . . . ", pp. 44–48.
P. Liu, J. Lightwave Tech., vol. LT-3, No. 1, Feb. 1985, "Power Fluctuations in the Side Modes . . . ", pp. 205–208.
R. A. Linke et al., J. Lightwave Tech., vol. LT-3, No. 3, Jun. 1985, "Mode Power Partition Events in Nearly . . . ", pp. 706–712.
D. C. Johnson et al., Elect. Lett., vol. 23, No. 13, Jun. 18, 1987, "New Design Concept for a Narrowband . . . ", pp. 668–669.
H. Nishimoto et al., J. Lightwave Tech., vol. 6, No. 5, May 1988, "New Method of Analyzing Eye Patterns . . . ", pp. 678–685.
N. Henmi et al., J. Lightwave Tech., vol. 6, No. 5, May 1988, "The Influence of Directly Modulated DFB LD . . . ", pp. 636–642.
M. M. Choy et al., Appl. Phys. Lett., 52 (21), May 23, 1988, "Origin of Modulation–Induced Mode Partition . . . ", pp. 1762–1764.
H. Ishikawa et al., Optoelectronics–Dev. & Tech., vol. 3, No 2, pp. 247–256, Dec. 1988, "DFB Lasers for High Bit-Rate . . . ".
K. Y. Liou et al., J. Lightwave Tech., vol. 7, No. 4, Apr. 1989, "Power Partition Fluctuations in Two–Mode– . . . ", pp. 632–639.
K. O. Hill et al., IEEE Photonics Tech. Lett., vol. 2, No. 7, Jul. 1990, "A Novel Low-Loss Inline Bimodal–Fiber . . . ", pp. 484–486.
K. O. Hill et al., Proc. of Conf. Opt. Fiber Comm., OFC'90, WM2, "WDM All-fiber Compound Devices . . . ", p. 99.

Primary Examiner—William L. Sikes
Assistant Examiner—Galen J. Hansen
Attorney, Agent, or Firm—Gregory C. Ranieri

[57] ABSTRACT

Accurate mode partition data from a laser are collected simply and rapidly in accordance with the principles of the invention wherein the laser output is directed to a filter which separates a central longitudinal mode from the side modes. The filter operates to present all side modes in a predetermined wavelength range simultaneously and continuously at the output of the filter. By subsequently comparing the intensity or power in the side modes delivered to the filter output with a predetermined threshold, it is possible to determine the frequency of occurrence and magnitude of mode partition events for side modes in the predetermined wavelength range. In one exemplary embodiment, the filter is realized by the combination of a Fabry-Perot etalon, whose longitudinal axis is angled with respect to the longitudinal axis (propagation axis) of the laser output beam directed onto the filter, together with an external reflector which is parallel to the Fabry-Perot etalon to permit multi-passing of the beam between the Fabry-Perot etalon and the reflector. The beam is reflected by the Fabry-Perot etalon so that after two or more passes within the filter only the side modes are output by the filter. In this arrangement, the filter acts as a notch filter having a wide passband and having an output for the side modes which is separate from an output for the main mode.

16 Claims, 3 Drawing Sheets

MODE PARTITION SCREENING APPARATUS

TECHNICAL FIELD

This invention relates to laser devices and, more particularly, to apparatus for characterizing modal behavior of the laser devices.

BACKGROUND OF THE INVENTION

Semiconductor lasers tend to have output spectra consisting of multiple longitudinal modes. Depending on the relative strengths of these modes, the lasers are classified as multi-mode or single mode. Single mode lasers are nominally single mode because their output comprises a dominant main mode and several small, yet measurable, modes at wavelengths near the wavelength of the main mode. While the average power in each side mode is usually quite small, the side modes are generally present. Moreover, the power of each individual longitudinal mode fluctuates from a zero power level to significant percentage of a full output power level at any time.

When a single mode laser is directly modulated to carry information in a lightwave communication system, the spectrum of each modulated digit comprises light output from the laser at the wavelengths corresponding to the main mode and to those side modes which were present during the formation of the particular information digit. After the modulated digit traverses a length of dispersive optical fiber, the different wavelengths of the longitudinal modes cause the modes comprising a digit to lose temporal correlation which may result in an error at the receiver. The error phenomenon caused by mode partitioning of the transmitting laser is especially exhibited in ASK and OOK systems. For systems employing high speed modulation and with transmission over long distances, mode partitioning degrades error rate performance and often introduces so-called "error rate floor" characteristics in the error rate versus average optical power system specifications. While lasers are being constantly refined to eliminate or just ameliorate the effects of mode partitioning, it is necessary to determine the propensity of the laser toward mode partitioning and degree of mode partitioning for each laser prior to installation in a system.

Various techniques have been demonstrated for capturing mode partitioning data from a modulated laser so that the performance of the laser may be characterized. The variety of techniques cover eye diagram mapping of the error rate, side mode suppression ratio analysis, inducing error by varying total dispersion, analyzing kinks in light-output versus current (L/I) curves, and mode sampling by spectrometer. In general, the latter technique is most widely accepted.

In eye diagram mapping, the receiver decision point is varied in amplitude and phase to collect an ensemble of different error rates. The laser under test transmits its signal over a full transmission system to the lightwave receiver. By plotting constant error rate contours as closed loops, it is possible to understand quantitatively the error rate distribution in the eye pattern. See, for example, *J. of Lightwave Tech.*, Vol. 6, No. 5, pp. 678-685 (1988). It is said that this technique and the eye pattern supply information about degraded performance resulting from an error rate floor and low probability phenomena which characterize laser performance. Even for high data rate systems, this test procedure requires long periods of time for data collection to obtain a statistically significant sampling of laser performance. Clearly, this technique is time consuming and provides only circumstantial evidence of mode partitioning in characterizing the laser at the remote end of the communication system. The latter detriment is so because the eye pattern data is assembled by collecting only error rate data from the receiver and then by stating without further supporting data that error performance of the laser was caused by mode partitioning events rather than by collecting mode partition event data together with the error rate data from the laser under test and then trying to correlate that partition event data with the error rate data.

Side mode suppression ratio analysis and analysis of kinks in the L/I curve for the laser have been found to provide a rough approximation of mode partitioning activity. For a description of the former technique, see *J. of Lightwave Tech.*, Vol. 6, No. 5, pp. 636-642 (1988). While these techniques are known to be useful, their utility is realistically limited to obtaining merely indications of mode partitioning without qualitative support.

For the mode distribution sampling by spectrometer technique, a number of references have shown similar experimental configurations. See, for example, *IEEE Trans. on Commun.*, Vol. COM-28, No. 2, pp. 238-243 (1980); *J. of Lightwave Tech.* Vol. LT-2, No. 1, pp. 44-48 (1984); and *J. of Lightwave Tech.* Vol. LT-3, No. 3, pp. 706-712 (1985). In general, these references show the laser output focused on a monochromator which is resolved to pass one longitudinal mode of the laser at any given time. High speed sampling is then used to record a historical record of the fluctuations of the selected mode being passed by the monochromator. Since many other longitudinal modes are rejected by the monochromator and after a statistically significant amount of data has been collected for the one mode being analyzed, it becomes important for completeness of this technique to adjust the monochromator to pass another longitudinal mode of the laser. Unfortunately, this technique is extremely time consuming, while producing mode partition data which is inaccurate because the data about partition events are collected sequentially from one longitudinal mode to the next. Infrequent, yet very important, partition events in other modes are missed when the monochromator is not resolved on the modes which are experiencing a partition event. As a result, statistical techniques are used during later data analysis to try to fill in missing data about partition events. It is also noted that mode sampling by spectrometer techniques are both polarization sensitive (dependent) and inherently lossy. Polarization sensitivity introduces additional complexity in the test procedure by requiring that the laser and the test equipment be aligned to optimize mode coupling and power transfer. Loss, on the other hand, is problematic when one considers the usual low power emitted in the modes to either side of the main (central) longitudinal mode of the laser.

SUMMARY OF THE INVENTION

Accurate mode partition data from a laser are collected simply and rapidly in accordance with the principles of the invention wherein the laser output is directed to a filter which separates a central longitudinal mode from the side modes. The filter operates to present all side modes in a predetermined wavelength range simultaneously and continuously at the output of the filter. By subsequently comparing the intensity or power in the side modes delivered to the filter output with a predetermined threshold, it is possible to determine the frequency of occurrence and magnitude of mode partition events for side modes in the predetermined wavelength range.

Polarization independent operation is achieved in all the inventive embodiments. Moreover, because all side modes are collected simultaneously and continuously, all mode partition events which occur in the predetermined wavelength range of the filter during data collection are measurable. Therefore, the mode partition data is collected with an accuracy heretofore unachievable.

In one exemplary embodiment, the filter is realized by the combination of a Fabry-Perot etalon, whose longitudinal axis is angled with respect to the longitudinal axis (propagation axis) of the laser output beam directed onto the filter, together with an external reflector which is parallel to the Fabry-Perot etalon to permit multi-passing of the beam between the Fabry-Perot etalon and the reflector. The beam is reflected by the Fabry-Perot etalon so that after two or more passes within the filter only the side modes are output by the filter. In this arrangement, the filter acts as a notch filter having a wide passband and having an output for the side modes which is separate from an output for the main mode.

Additional features of the invention include having the filter output the main longitudinal mode of the laser output, tunability of the filter notch wavelength, controllability of the filter notch FWHM, and employing the intensity or power of the main longitudinal mode or a value related thereto as the comparison threshold. Exemplary elements embodying the features above are disclosed in the following description. Also, alternative filter arrangements are presented.

BRIEF DESCRIPTION OF THE DRAWING

A more complete understanding of the invention may be obtained by reading the following description of a specific illustrative embodiment of the invention in conjunction with the appended drawing in which.

The various exemplary embodiments of the invention shown in the FIGS. have not been drawn to scale and are merely for purposes of illustration and not limitation. Exemplary dimensions of the devices shown in the FIGS. are stated hereinbelow.

DETAILED DESCRIPTION

Mode partition detection is achieved by utilizing an optical filter arrangement which provides an accurate, broadband characterization of side longitudinal mode activity for a laser whose light beam is directed onto the filter. The optical filter arrangement in different embodiments is configured as a multi-port device in which the laser light beam is directed onto one port and in which, after separation in the filter, the side longitudinal modes are delivered to a second port while the main or central longitudinal mode is delivered to an optional third port. In effect, the optical filter notches out the light in the main mode and leaves only the light in the laser side modes. The transfer function of the filter response bears resemblance to a notch filter characteristic. As a result, mode partitioning measurements are made by detecting a weak partitioning pulse effectively without the main mode being present so that presence of a pulse indicates the existence of a mode partition event while the magnitude of the pulse indicates the qualitative degree of partitioning.

Figure 1:
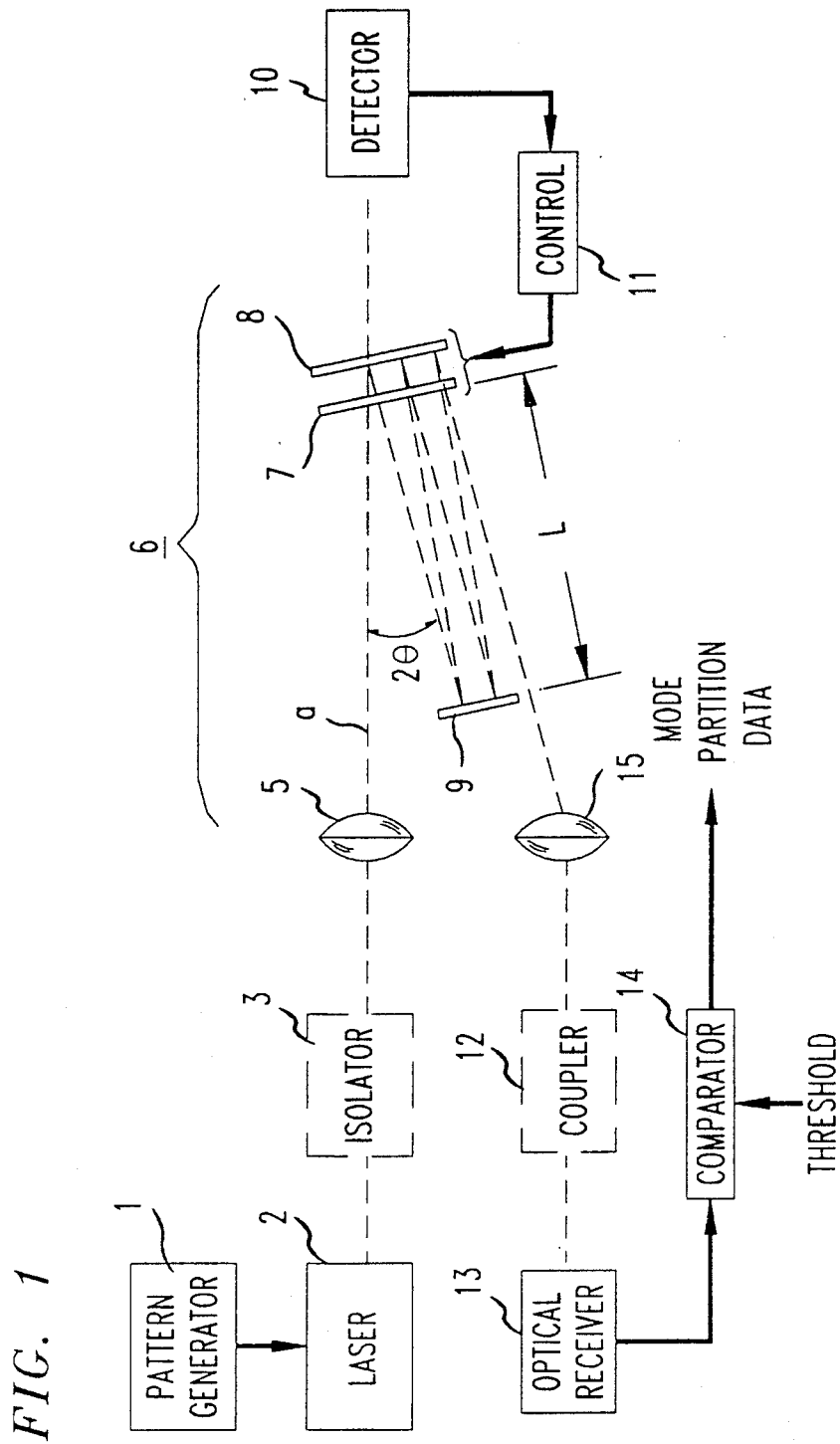
FIG. 1 shows a block diagram of apparatus for measuring dynamic mode partitioning in accordance with the principles of the invention.

An exemplary embodiment of the arrangement is shown in FIG. 1. Solid directed lines represent electrical signal paths whereas dashed lines represent optical signal paths. As shown in FIG. 1, laser 2 is biased at or near a lasing threshold and electrically modulated such as OOK or ASK by pattern generator 1. As such, the lower intensity (OFF) state of the laser occurs at or near the lasing threshold. The output light beam from the laser is said to be intensity modulated and is generally coupled from the laser into a short pigtail (not shown) of single mode fiber which is lensed at the end interfacing with the laser. It should be noted that laser 2 exhibits nominally single longitudinal mode behavior. Such lasers include distributed feedback (DFB) lasers, distributed Bragg reflector (DBR) lasers, coupled cavity and cleaved-coupled cavity ($C^3$) lasers, and the like. A light beam from laser 2 is supplied to isolator 3 which is a standard optical isolator designed to prevent return reflections from splices, mirrors or interconnections from entering the laser cavity and interfering with normal operation. Coupling lens 5 is shown collimating the laser output light beam into filter arrangement 6.

Filter arrangement 6 includes a Fabry-Perot etalon formed by reflectors 7 and 8 in combination with external reflector 9. The Fabry-Perot etalon is tilted slightly by an angle $\theta$, usually less than 5°, to have its longitudinal axis slightly angled from the propagation (longitudinal) axis of the light beam. The longitudinal axis of the Fabry-Perot etalon is the axis normal to reflectors 7 and 8. The tilted relationship between the Fabry-Perot etalon and the light beam permits the reflected wavelengths from the Fabry-Perot etalon to exit from reflector 7 along a path which does not interfere with the incoming light beam from laser 2. It should be noted that the tilt angle $\theta$ is selected to avoid reducing finesse of the Fabry-Perot etalon. External reflector 9 returns the light exiting the Fabry-Perot etalon through reflector 7 to the Fabry-Perot etalon; external reflector 9 is parallel to reflectors 7 and 8 of the Fabry-Perot etalon to permit the light beam emerging from reflector 7 to effectively "walk off" the surfaces of the Fabry-Perot etalon and reflector 9. External reflector 9 is generally very high reflectivity and is separated from the Fabry-Perot etalon by a distance L which, together with the tilt $\theta$ of the Fabry-Perot etalon and the diameter $a$ of the radiated beam causes the light at wavelengths reflected by the Fabry-Perot etalon to be returned to the Fabry-Perot etalon for additional passes. A minimum separation distance L is given as approximately $a/\theta$, where $\theta$ is small and expressed in radians. As shown in FIG. 1, external reflector 9 causes the light beam to undergo three passes in the Fabry-Perot etalon before finally emerging on output coupling lens 15. In order for filter arrangement 6 to provide a notch transfer characteristic which substantially removes the main longitudinal mode, the Fabry-Perot etalon is tuned to the wavelength of the main longitudinal mode of laser 2. It is understood that the side longitudinal modes representing the mode partitioning events are contained in the light beam emerging from the reflection side of the Fabry-Perot etalon through reflector 7.

For the arrangement shown in FIG. 1, transverse dimensions of reflector 9 are selected to permit the desired multi-passing effect while also permitting the laser output beam and the final output beam from the Fabry-Perot etalon to pass therearound without interference. In general, minimum transverse dimensions of reflector 9 are on the order of two beam diameters.

As stated above, the main longitudinal mode to which the Fabry-Perot etalon is turned is output from the transmission side of the Fabry-Perot etalon through reflector 8. This light beam is detected by detector 10 which may include a PIN photodetector. Detector 10 supplies its output to control element 11 which uses the low frequency components of the supplied signal to lock the Fabry-Perot etalon to the wavelength of the main longitudinal mode of laser 2.

Once the side longitudinal modes have been separated from the main longitudinal mode by the filter arrangement 6, the side modes are suitable for data collection and processing. A standard coupler 12 guides the side mode light beam to optical receiver 13. Coupler 12 may have additional output ports and, therefore, may permit connection of other output devices such as an optical spectrum analyzer for additional data collection functions. Optical receiver 13 is a standard square law device such as a high speed photodetector circuit having sufficient bandwidth, at least several GHz, to capture the high speed mode partition events. AC-coupling of the receiver is generally employed to ignore DC components and to view more clearly the fast mode partitioning events. The output from optical receiver 13 is supplied to comparator 14. A threshold level is supplied to comparator 14 to determine the appropriate level for accepting mode partition events. When the signal from receiver 13 exceeds the threshold at comparator 14, the comparator outputs a signal which indicates the occurrence of a mode partition event and, if desired, the magnitude of the mode partition event. In an example from experimental practice, a real-time oscilloscope (Tektronix 7104) with 1 GHz bandwidth was employed as high speed comparator 14 wherein the threshold was provided to the internally triggered oscilloscope input through a standard bias tee with the signal from receiver 13. A counter coupled to the gate output of the oscilloscope recorded the data relating to the number of partition events which exceeded the threshold in a particular time period.

Isolator 3 and coupler 12 have been displayed as dashed boxes to indicate that their use is optional. It should also be noted that input coupling lens 5 and output coupling lens 15 may be eliminated when the input and output beams for filter arrangement 6 are collimated.

Figure 2:
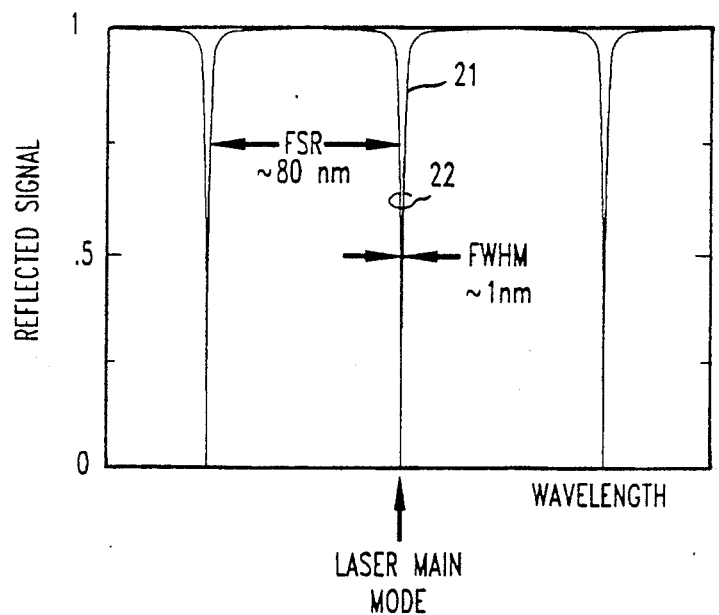
FIG. 2 shows a plot of calculated intensity reflectivity versus wavelength for a Fabry-Perot interferometer employed in the apparatus shown in FIG. 1.

In an example from experimental practice, a plano Fabry-Perot etalon was used incorporating a Burleigh Model RC-110 with 2-inch diameter mirrors having NR-1 coatings as reflectors 7 and 8. The transmission peak of the etalon was positioned at the wavelength corresponding to the main longitudinal mode of the laser and the reflected light was monitored through lens 15 to determine mode partitioning. As shown in FIG. 2, the wavelength dependence of the signal reflected by the Fabry-Perot etalon exhibits an optical notch filter characteristic in which the main longitudinal mode is rejected, that is, separated from the side modes, and the side modes are passed. This rejection is shown as notch 22 of curve 21. Units for the ordinate are measured as the ratio of the reflected signal to the input signal powers. In the example, the Fabry-Perot etalon had a finesse of approximately 80 and a plate separation of 15 $\mu$m. These parameters give rise to a free spectral range for the Fabry-Perot etalon of approximately 80 nm when the full width at half minimum is approximately 1 nm. It should be noted that, for this example, laser 2 was an 1.7 Gbps ASK modulated DFB semiconductor laser having an operating wavelength of approximately 1.5 $\mu$m. The operating wavelength is the location of the main longitudinal mode of the laser.

For the arrangement shown in FIG. 1, the number of passes undergone by the laser output light beam in filter 6 determines the degree of rejection experienced by the main mode. We have determined that, for a single pass, the main longitudinal mode was rejected by approximately 14 dB. For two passes, this rejection capability was increased to approximately 30 dB. Ultimately, by adding a third pass, the Fabry-Perot etalon exhibited a main mode rejection capability greater than 45 dB. It will be understood by those skilled in the art that basic techniques known in the field of optics are utilized to vary the characteristics of the filter with respect to tuning to the main mode wavelength and varying the amount of main mode rejection. These techniques include, but are not limited to, adjusting the tilt of the Fabry-Perot etalon relative to the laser output beam, adjusting the tilt of the external reflector relative to the longitudinal axis of the Fabry-Perot etalon, varying the distance between the external reflector and the Fabry-Perot etalon, and changing the reflector spacing of the Fabry-Perot etalon.

Figure 3:
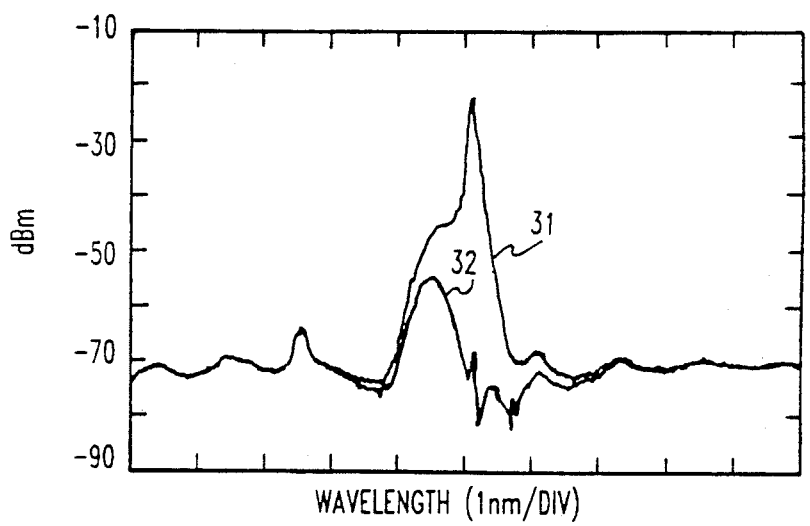
FIG. 3 shows plots of the laser spectrum before and after filtering by the optical notch filter shown in FIG. 1.
Figure 4:
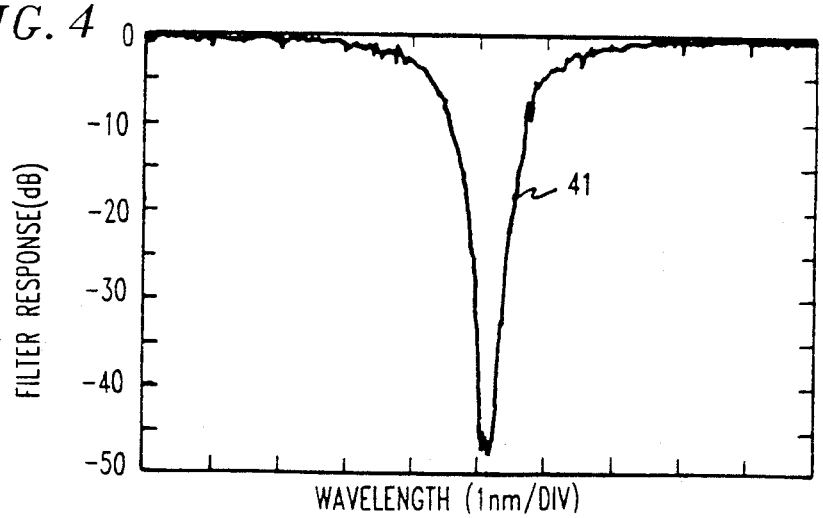
FIG. 4 shows a plot of the transfer function for the optical notch filter shown in FIG. 1 and characterized in FIG. 3.

For the exemplary optical notch filter described above, filtering of the laser output beam is shown in FIG. 3. Curve 31 shows the spectrum of the output light beam from the laser under ASK modulation as described above. Curve 32 shows the light beam output from the filter after the three passes. As seen from a comparison of curves 31 and 32, most of the light corresponding to the main longitudinal mode has been rejected by (i.e., separated from the side longitudinal modes) filter 6. It should be noted that some light corresponding to the main mode signal occurs in curve 32 because, at every OFF-ON transition of the ASK modulated laser output beam, the main mode is caused to chirp out of the filter bandwidth. Chirping is a well known frequency modulation process. By taking a ratio of curves 31 and 32, it is possible to calculate the transfer function of filter 6. This transfer function is shown as curve 41 in FIG. 4. From this transfer function, it is apparent that, for a wavelength difference greater than 1.5 nm away from the notch, only 0.3 dB of the light in the side longitudinal modes is lost. As such, the exemplary filter described above is an excellent tool for measuring mode partitioning.

Figure 5:
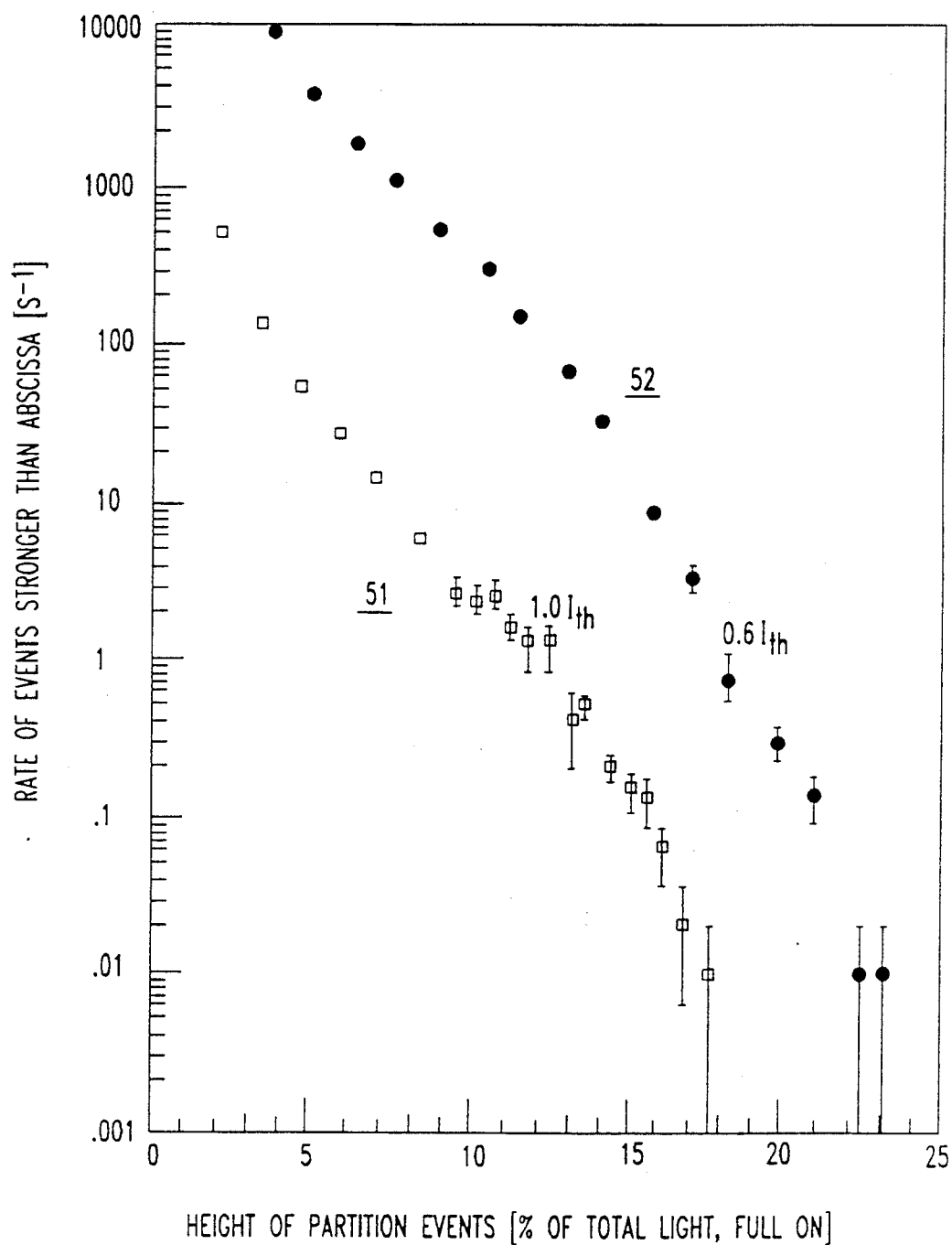
FIG. 5 shows distributions of mode partition pulse heights for an exemplary single mode laser under two different bias conditions as measured using the apparatus of FIG. 1.

In operation, the mode partitioning signal takes the form of pulses which occur infrequently and at random ON transitions within the pseudo-random sequence from the pattern generator. As observed, the frequency of the pulses appears to be less than approximately $10^4$ sec$^{-1}$. Pulse widths are limited by the bandwidth of the oscilloscope used in comparator 14, while pulse heights are distributed over a wide continuum. In the example above, pulse widths are limited to a duration of approximately 1 ns. With respect to pulse heights, the distribution is such that smaller pulses occur more frequently than large pulses. Mode partitioning is measured using the oscilloscope trigger circuit as a high speed comparator to output a pulse whenever the input signal exceeds an applied threshold. In order to obtain a distribution of mode partition pulse heights, the threshold level is varied over the range of expected pulse heights. For each threshold level, output pulses from the comparator are counted for a sufficient period of time to obtain an average partitioning rate for pulses having a height greater than or equal to the predetermined threshold level. In our experimental practice, the period of time necessary to achieve averaging was between 1 and 100 seconds. The cumulative distributions of mode partition pulse heights for one DFB laser are shown in FIG. 5. Distribution 51 (open squares) represents the distribution when the laser is biased at 1.0 $I_{th}$; distribution 52 (filled circles) represents the distribution when the laser is biased at 0.6 $I_{th}$. As shown in FIG. 5, the observed partitioning rate decreases as a substantially exponential function of the pulse height. The measured partitioning distribution can be appropriately convolved with the receiver noise characteristic to estimate the maximum error floor of the laser under test.

Filter 6, as described herein, provides a notch characteristic which is sufficiently broad to remove the main longitudinal mode of most semiconductor lasers with chirp. It also provides a notch characteristic which is sufficiently deep to expose weak activity in the side longitudinal modes. The filter shown above provides tunability by varying the reflector spacing at least over the wavelength range from 1.25 $\mu$m to 1.65 $\mu$m. The particular filter shown in FIG. 1 passes a signal which has a magnitude related to the cumulative strength of all partitioning modes. Therefore, the filter arrangement provides a measure of mode partitioning in the worst case. Additional benefits of the filter arrangement shown in FIG. 1 are polarization independence, low loss, and realization using commercially available optics and electronic components.

Tunability of the filter is a desirable feature because most lasers vary with respect to the absolute wavelength of the main longitudinal mode. This is true even for lasers which are grown on the same semiconductor wafer. If, instead of tuning the filter to the wavelength of the main longitudinal mode, one tunes the laser to the notch wavelength of the filter, then it is possible to introduce distortion in the output spectrum of the laser. Hence, the characterization of mode partitioning will not be accurate.

For most semiconductor laser applications, it is desirable to utilize a notch filter which is sufficiently narrow to reject only the main mode while passing substantially all the side modes. Of course, the rejection strength must be sufficiently large so that one can view side mode activity.

With the above characteristics in mind, it is possible to conceive additional optical notch filters which operate in accordance with the spirit and scope of the present invention. For example, it is possible to use a dispersive element such as a grating or prism in combination with a mask to remove undesired wavelengths of light corresponding to the main mode while recollecting the remaining light at the side mode wavelengths. Of course, physical masking may be replaced by a technique which involves a slotted reflector which recollects side mode light and passes main mode light through the slot.

Additional wavelength selective optical filter implementations have been realized in fiber for wavelength division multiplexed communication applications. These implementations include a wavelength-selective inline bimodal-fiber tap described in both *IEEE Photonics Technology Lett.*, Vol. 2, No. 7, pp. 484-6 (1990) and *Proceedings of Conf. Opt. Fiber Commun.*, OFC '90, Paper WM2, p. 99, Jan. 22-26, 1990; a Mach-Zehnder interferometer structure employing distributed Bragg reflection gratings in each arm of the interferometer described in *Elect. Lett.*, Vol. 23, pp. 668-9 (1987); and a helical-grating bimodal-fiber spatial mode coupler described in commonly assigned U.S. patent application Ser. No. 435,849 filed Nov. 13, 1989 and identified as C. D. Poole Case 1. The latter arrangement has been demonstrated in optical fiber by coupling the light from a single mode fiber (the input port) completely into only one of the modes of a length of bimodal fiber. Along this length of bimodal fiber, perturbations are applied to mix the light in the two modes. By introducing these perturbations periodically the light from only a narrow range of wavelengths will appear in one mode and all other wavelengths in the other. By coupling the desired mode back into a single mode fiber the transfer function of a notch filter is obtained. All the filter implementations in fiber listed above lack tunability, narrow notch bandwidth, deep extinction and polarization insensitivity.

While the Fabry-Perot etalon described above employs a standard air cavity, it is understood by those skilled in the art that solid or filled cavity Fabry-Perot etalons and even fiber Fabry-Perot etalons may be employed in the practice of this invention.

We claim:

1. Apparatus for observing mode partitioning activity in a radiated beam from a laser emitting said beam in a single main longitudinal mode and a plurality of side longitudinal modes, the apparatus comprising means tuned to a first wavelength corresponding substantially to said main longitudinal mode for separating said main longitudinal mode of said radiated beam from said plurality of side longitudinal modes to provide substantially all of said plurality of side longitudinal modes in a predetermined range of wavelengths simultaneously at a first output, and square law means for detecting a power characteristic of said plurality of side longitudinal modes output from said mode separating means.

2. The apparatus as defined in claim 1 further including means responsive to said square law means for comparing said power characteristic to a predetermined threshold to indicate occurrence of a mode partitioning event when said power characteristic exceeds said threshold.

3. The apparatus as defined in claim 1 wherein said separating means further includes a second output for providing access to said main longitudinal mode.

4. Apparatus for observing mode partitioning activity in a radiated beam from a laser emitting said beam in a single main longitudinal mode and a plurality of side longitudinal modes, the apparatus comprising means tuned to a first wavelength corresponding substantially to said main longitudinal mode for separating said main longitudinal mode of said radiated beam from said plurality of side longitudinal modes to provide substantially all of said plurality of side longitudinal modes in a predetermined range of wavelengths simultaneously at a first output, and square law means for detecting a power characteristic of said plurality of side longitudinal modes output from said mode separating means, said means for seaparating comprising:

a Fabry-Perot etalon including first and second reflector elements in substantially parallel relationship separated from each other by a distance sufficient to cause transmission of said first optical wavelength therethrough, said first reflector element being an input port for said radiated beam having a collimated beam width $a$, said first reflector element having its normal axis tilted by an angle $\gamma$ to a longitudinal axis of said radiated beam, and a third reflector element disposed external to said Fabry-Perot etalon and substantially parallel to and adjacent said first reflector element being separated therefrom by a distance L, to permit multi-passing of reflected component of said radiated beam between said Fabry-Perot etalon and said third reflector, said filtering means having a first output port through said second reflector element for said main longitudinal mode and said filtering means further having a second output port at said first reflector element for said plurality of side longitudinal modes in the range of predetermined wavelengths, said second output port being spatially separated from said input port.

5. The optical filter as defined in claim 4 further including means connected to said Fabry-Perot etalon for adjustably controlling the distance separating said first and second reflector elements.

6. The optical filter as defined in claim 5 further including input means coupled to said input port of said first reflector element for collimating said radiated beam being supplied to the first reflector element, and output means coupled to said output port of said first reflector element for focussing said optical beam being output from the first reflector element.

7. An optical filter arrangement comprising a Fabry-Perot etalon including first and second reflector elements in substantially parallel relationship separated from each other by a distance sufficient to cause transmission of a first optical wavelength therethrough, said first reflector element being an input port for an optical beam having a collimated beam width $a$, said first reflector element having its normal axis tilted by an angle $\theta$ to a longitudinal axis of said optical beam, and a third reflector element disposed external to said Fabry-Perot etalon and substantially parallel to and adjacent said first reflector element being separated therefrom by a distance L, to permit multi-passing of reflected component of said optical beam between said Fabry-Perot etalon and said third reflector, said optical filter having a first output port through said second reflector element for components of said optical beam substantially at said first optical wavelength and said optical filter further having a second output port through said first reflector element for components of said optical beam at other than substantially said first optical wavelength, said second output port being spatially separated from said input port.

8. The optical filter as defined in claim 7 further including input means coupled to said input port of said first reflector element for collimating said optical beam being supplied to the first reflector element.

9. The optical filter as defined in claim 8 wherein the input means further includes an optical isolator for providing unidirectional propagation of said optical beam to the input port.

10. The optical filter as defined in claim 7 further including means connected to said Fabry-Perot etalon for adjustably controlling the distance separating said first and second reflector elements.

11. The optical filter as defined in claim 7 further including output means coupled to said output port of said first reflector element for focussing said optical beam being output from the first reflector element.

12. The optical filter as defined in claim 7 further including input means coupled to said input port of said first reflector element for collimating said optical beam being supplied to the first reflector element, and output means coupled to said output port of said first reflector element for focussing said optical beam being output from the first reflector element.

13. The optical filter as defined in claim 12 wherein the input means further includes an optical isolator for providing unidirectional propagation of said optical beam to the input port.

14. The optical filter as defined in claim 13 further including means connected to said Fabry-Perot etalon for adjustably controlling the distance separating said first and second reflector elements.

15. The apparatus as defined in claim 10 wherein the filtering means further includes input means coupled to said input port of said first reflector element for collimating said radiated beam being supplied to the first reflector element.

16. The optical filter as defined in claim 15 wherein the input means further includes an optical isolator for providing unidirectional propagation of said optical beam to the input port.

* * * * *